(12) United States Patent
Takimoto

(10) Patent No.: US 7,939,860 B2
(45) Date of Patent: May 10, 2011

(54) SOLID-STATE IMAGING DEVICE

(75) Inventor: Kaori Takimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 107 days.

(21) Appl. No.: 12/389,864

(22) Filed: Feb. 20, 2009

(65) Prior Publication Data

US 2009/0230496 A1 Sep. 17, 2009

(30) Foreign Application Priority Data

Mar. 12, 2008 (JP) ................. 2008-062487

(51) Int. Cl.
*H01L 27/148* (2006.01)
(52) U.S. Cl. ........ 257/233; 257/291; 257/292; 257/458; 257/E27.133
(58) Field of Classification Search .......... 257/291, 257/233, 239, 292, 458, E27.132, E27.133
See application file for complete search history.

(56) References Cited

U.S. PATENT DOCUMENTS

2005/0202584 A1* 9/2005 Mouli ............................ 438/48
2006/0054937 A1* 3/2006 Lucovsky et al. ............. 257/213

FOREIGN PATENT DOCUMENTS

JP 2003-338615 11/2003

* cited by examiner

*Primary Examiner* — Minh-Loan T Tran
*Assistant Examiner* — Leslie Pilar Cruz
(74) *Attorney, Agent, or Firm* — SNR Denton US LLP

(57) ABSTRACT

Disclosed herein is a solid-state imaging device including: a semiconductor substrate; a sensor of impurity diffusion layer formed on the surface layer of said semiconductor substrate; a negative charge accumulation layer formed on said sensor from an insulating material containing a first metallic substance; and an interfacial layer formed between said sensor and said negative charge accumulation layer from an insulating material containing a second metallic substance having greater electronegativity than said first metallic substance.

7 Claims, 4 Drawing Sheets

× ··· INTERFACE STATE

PART A

× ··· INTERFACE STATE

SOLID-STATE IMAGING DEVICE

CROSS REFERENCES TO RELATED APPLICATIONS

The present invention contains subject matter related to Japanese Patent Application JP 2008-062487 filed in the Japan Patent Office on Mar. 12, 2008, the entire contents of which being incorporated herein by reference.

BACKGROUND OF THE INVENTION

1. Field of the Invention

The present invention relates to a solid-state imaging device and, more particularly, to a solid-state imaging device capable of compensating the interface state of the surface of a semiconductor substrate with photoelectric converting sensors formed thereon.

2. Description of the Related Art

Video cameras and digital still cameras are commonly equipped with a solid-state imaging device composed of CCD (Charge Coupled Device) or CMOS (Complementary Metal Oxide Semiconductor) image sensors. Solid-state imaging devices of any kind have important problems with sensitivity improvement and noise reduction.

Noise involved in solid-state imaging devices is due to dark current. Dark current is a very small current that occurs in the absence of incident light. In other words, the interface of the substrate of the light receiving surface has minute defects that generate charges (or electrons) behaving like signals even though there exist no pure signal charges originating from photoelectric conversion of incident light. Dark current also originates from the interface state at the interface between the sensor and the film of upper layer.

One of the known ways of suppressing dark current originating from the interface state is by employing the so-called HAD (Hole Accumulated Diode) structure. HAD is a photodiode of buried type which has a hole accumulation layer or a P+ layer on the sensor (e.g., photodiode).

As shown in FIG. 4, which is a sectional view, the HAD structure is composed of an N-type semiconductor substrate 101 and a buried photodiode D formed thereon. The photodiode D is composed of a P-well diffusion layer 102 and an N-type diffusion layer 103, which are sequentially arranged upward from the surface of the substrate 101. The top of the photodiode D is coated with a hole accumulation layer 104 which is a P+ impurity diffusion layer. The hole accumulation layer 104 is further coated with an insulating film 105, whose surface functions as a photodetecting surface.

The above-mentioned HAD structure offers the following advantage. Even though charges (or electrons) due to the interface state occur at the interface (or the surface of the hole accumulation layer 104) between the insulating film 105 and the semiconductor substrate 101, the hole accumulation layer 104 formed on the buried photodiode D prevents such electrons from flowing from the N-type diffusion layer 103 (as a constituent of the photodiode D) into the charge accumulation part but allows them to flow into the hole accumulation layer 104 (or P+ layer) abounding with holes in which they disappear. Thus, the negative charges arising from the interface state do not generate dark current to be detected.

The HAD structure mentioned above can be applied to either CCD image sensors or CMOS image sensors. It can also be applied to related-art image sensors of top-side illumination type as well as new image sensors of back-side illumination type (disclosed in Japanese Patent Laid-open No. 2003-338615).

The HAD structure is usually produced in the following manner. The semiconductor substrate 101 is provided with the photodiode D thereon. The photodiode D is coated with the insulating film 105 which is a thermally oxidized silicon oxide film or CVD (Chemical Vapor Deposition)-oxidized silicon oxide film. The insulating film 105 undergoes ion implantation so that P-type impurities, such as boron (B) and boron difluoride ($BF_2$), are introduced into the surface layer of the semiconductor substrate 101 (or the surface layer of the photodiode D). The thus introduced impurities are activated by annealing so as to form the hole accumulation layer 104 (which is a P+ impurity diffusion layer) near the interface.

SUMMARY OF THE INVENTION

The foregoing related-art technology to form the hole accumulation layer 104 suffers the disadvantage of requiring annealing at a high temperature (above 700° C.) for activation of impurities introduced into the surface layer of the semiconductor substrate 101. In other words, it involves difficulties in forming the hole accumulation layer 104 by a low-temperature process below 400° C. Moreover, high-temperature annealing above 700° C. inevitably causes diffusion of impurities in previously formed impurity layers.

In view of the fact that the N-type diffusion layer 103 of the photodiode D accumulates charges, which are read out by voltage application to the transfer gate formed on the semiconductor substrate 101 and adjacent to the HAD structure, and this voltage application forms a channel on the surface layer of the semiconductor substrate 101 adjacent to the photodiode D, thereby transferring charges to the floating diffusion of the N-type diffusion layer, the N-type diffusion layer 103 should be as shallow as possible and consequently the hole accumulation layer 104 thereon should be as thin as possible, in consideration of efficient charge transfer. This holds true for both CMOS sensors and CCD sensors.

Unfortunately, there is a trade-off between the thickness of the hole accumulation layer 104 and the amount of dark current arising from the interface state at the surface of the HAD structure. That is, dark current increases according as the hole accumulation layer 104 becomes thinner. Moreover, the thickness of the hole accumulation layer 104 depends greatly on the thickness of the insulating film 105 through which the hole accumulation layer 104 undergoes ion implantation. The thinner the insulating film 105 becomes, the more the hole accumulation layer 104 varies in thickness and the more the amount of dark current increases.

There is a need for the present invention to provide a solid-state imaging device which does not need the hole accumulation layer (which is an impurity diffusion layer requiring high-temperature heat treatment) to reduce dark current arising from the interface state and which has the sensor formed at a shallow position in the semiconductor substrate for efficient charge transfer.

The solid-state imaging device according an embodiment of to the present invention includes a semiconductor substrate, a sensor of impurity diffusion layer formed on the surface layer of said semiconductor substrate, a negative charge accumulation layer formed on said sensor from an insulating material containing a first metallic substance, and an interfacial layer formed between said sensor and said negative charge accumulation layer from an insulating material containing a second metallic substance having greater electronegativity than said first metallic substance.

In the solid-state imaging device constructed as mentioned above, the interfacial layer produces dipoles, with one side (adjacent to the negative charge accumulation layer) positively charged and the other side (adjacent to the sensor or the semiconductor substrate) negatively charged. The resulting dipoles produce negative bias in the negative charge accumulation layer, thereby effectively attracting positive charges to the surface of the semiconductor substrate to form the hole accumulation layer that compensates the interface state.

The solid-state imaging device according to the embodiment of the present invention has an interfacial layer between the sensor formed on the semiconductor substrate and the negative charge accumulation layer. This interfacial layer generates dipoles therein that effectively attract positive charges to the surface of the semiconductor substrate, thereby forming the hole accumulation layer that compensates the interface state. Therefore, it constitutes the HAD structure to prevent dark current without the necessity of forming on the sensor surface the hole accumulation layer which is an impurity diffusion layer that needs high-temperature heat treatment. The result is that the sensor can be formed shallow in the surface of the semiconductor substrate and charges can be transferred efficiently to the floating diffusion arranged through the gate electrode adjacent to the sensor.

DETAILED DESCRIPTION OF THE PREFERRED EMBODIMENT

Figure 4:
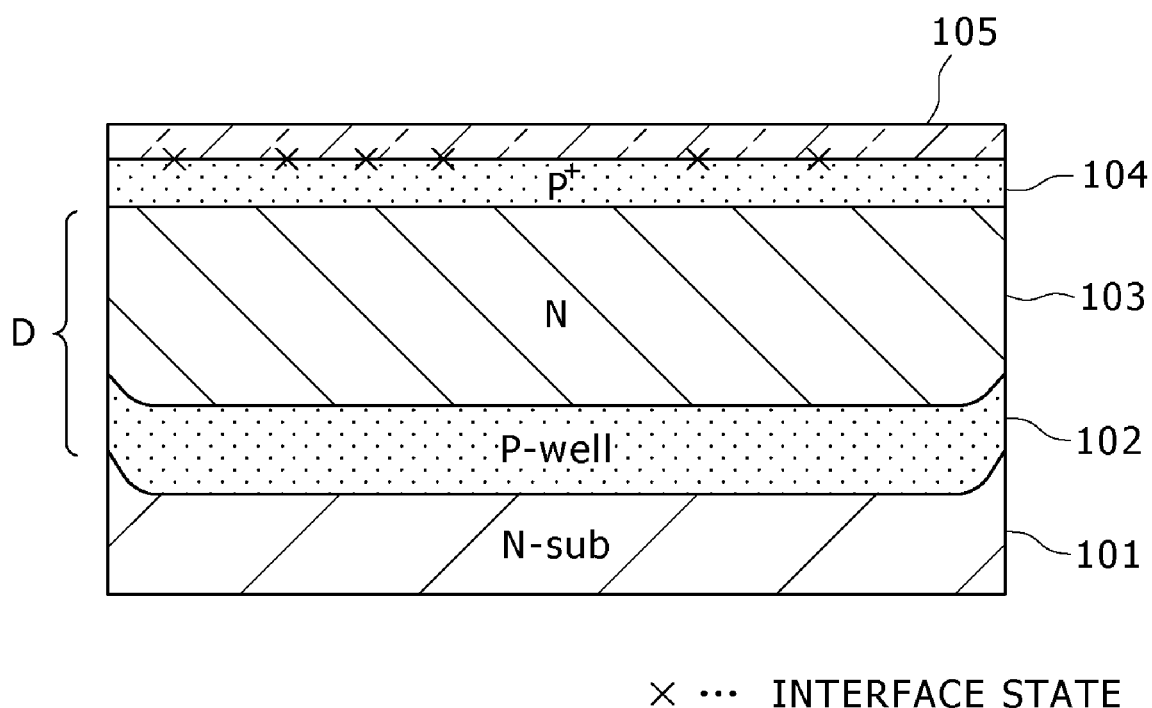
FIG. 4 is a sectional view of important parts of the related-art solid-state imaging device.

The following is a detailed description of the solid-state imaging device according to an embodiment of the present invention shown in the accompanying drawings, in which the same constituents as in FIG. 4 are given the same symbols.
<Solid-state Imaging Device>

Figure 1:
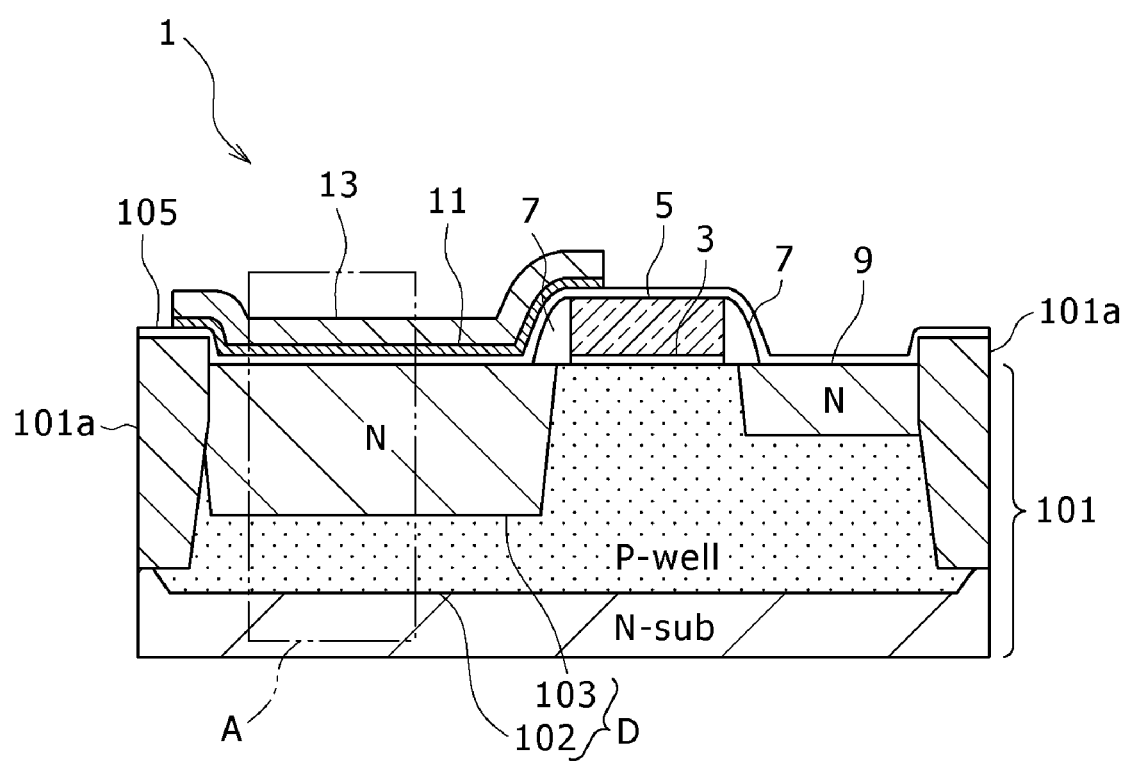
FIG. 1 is a sectional view showing important parts of the solid-state imaging device according to an embodiment of the present invention.
Figure 2:
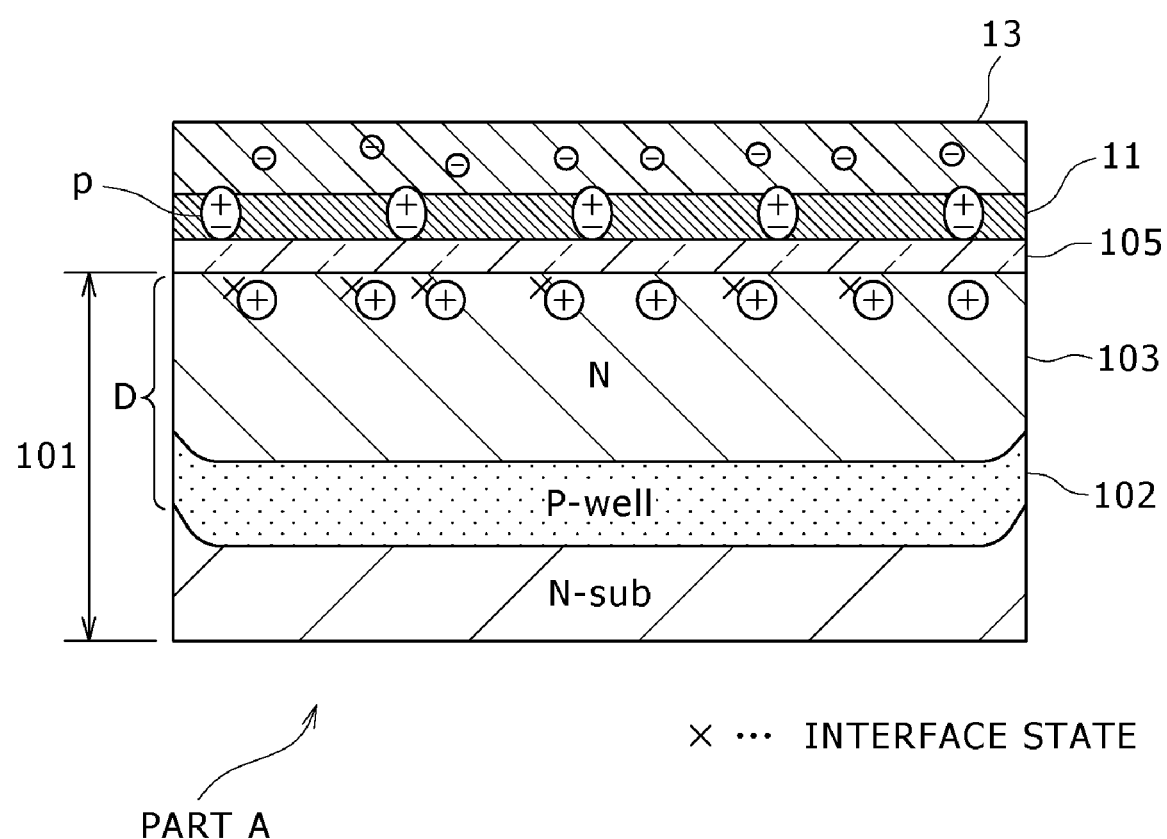
FIG. 2 is an enlarged sectional view showing the important parts to illustrate the compensation of the interface state in the solid-state imaging device according to the embodiment of the present invention.

FIG. 1 is a sectional view showing important parts of a solid-state imaging device 1 according to the embodiment of the present invention. The solid-state imaging device 1 contains a CMOS sensor, and the figure represents the sensor for one pixel. FIG. 2 is an enlarged view showing part A in FIG. 1. As shown in these figures, the solid-state imaging device 1 is one which contains a sensor of HAD structure and is constructed as follows.

The semiconductor substrate 101 is formed from N-type single-crystal silicon. It is divided into individual pixel regions by the shallow trench isolation (STI) 101a. That part of the semiconductor substrate 101 which corresponds to each pixel region divided by the isolation 101a has the P-well diffusion layer 102 formed thereon. The semiconductor substrate 101 also has the transfer gate 5 formed thereon, with the gate insulating film 3 interposed between them. The transfer gate 5 is patterned in such a way that it traverses the P-well diffusion layer 102. The gate insulating film 3 is a silicon oxide film or may be formed from a high dielectric material such as hafnium oxide. The transfer gate 5 may be a polysilicon film or may be formed from a metallic substance. The transfer gate 5 has the insulating side wall 7. The P-well diffusion layer 102 in each pixel region additionally has a reset gate and an amplifier gate, which are not shown in the figure.

One side of the pixel region divided by the transfer gate 5 functions as the light-receiving region. The P-well diffusion layer 102 in the light-receiving region has the N-type diffusion layer 103 formed thereon, so that the P-well diffusion layer 102 and the N-type diffusion layer 103 combined together constitute the diode D. The diode D constructed in this manner causes charges resulting from photoelectric conversion to accumulate in the N-type diffusion layer 103. Thus, the N-type diffusion layer 103 functions as the charge accumulation layer.

In the other side of the transfer gate 5 is the floating diffusion 9 of N-type diffusion layer, which is formed on the surface of the P-well diffusion layer 102.

The semiconductor substrate 101, on which are formed the above-mentioned isolation 101a, transfer gate 5, diode D, and floating diffusion 9, is coated with the silicon oxide film 105, which reduces the interface state of the semiconductor substrate 101 of single-crystal silicon.

The silicon oxide film 105 in the light-receiving region, in which the diode D is formed, is coated by patterning with the negative charge accumulation layer 13, with the interfacial layer 11 interposed between them.

The uppermost negative charge accumulation layer 13 is a film having negative fixed charges. It is formed from an insulating material containing a first metallic substance. The insulating material should preferably be an oxide of a first metallic substance. It should contain at least partly crystallized regions. Examples of said first metallic substance include hafnium (Hf), zirconium (Zr), aluminum (Al), tantalum (Ta), titanium (Ti), yttrium (Y), and lanthanoids (La, Ce, Pr, Nd, Pm, Sm, Eu, Gd, Tb, Dy, Ho, Er, Tm, Yb, Lu).

The negative charge accumulation layer 13 may be a film of hafnium oxide ($HfO_2$), aluminum oxide ($Al_2O_3$), zirconium oxide ($ZrO_2$), tantalum oxide ($Ta_2O_5$), or titanium oxide ($TiO_2$). These films have been practically used as the gate insulating film of insulated gate FET (Field Effect Transistor). Therefore, they can be easily formed by any established method, including chemical vapor deposition, sputtering, and atomic layer vapor deposition. The last one is desirable because it forms an $SiO_2$ layer (about 1 nm thick) to reduce the interface state, at the same time as it forms the oxide film. Other materials than mentioned above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$).

The negative charge accumulation layer 13 mentioned above may contain silicon (Si) or nitrogen (N) in an amount not harmful to its insulating performance. Such additional elements contribute to heat resistance and effectively prevent ion implantation during processing.

It is assumed here that the negative charge accumulation layer 13 is a film of hafnium oxide.

The interfacial layer 11 is formed from an insulating material containing a second metallic substance having greater electronegativity than a first metallic substance contained in the negative charge accumulation layer 13. A preferred insulating material is an oxide of a second metallic substance. If a first metallic substance contained in the negative charge accumulation layer 13 is hafnium (Hf), a second metallic substance to be contained in the interfacial layer 11 should be any of aluminum (Al), titanium (Ti), tantalum (Ta), vanadium (V), niobium (Nb), protactinium (Pa), chromium (Cr), molybdenum (Mo), tungsten (W), manganese (Mn), technetium (Tc), rhenium (Re), ruthenium (Ru), cobalt (Co), and nickel (Ni). It is assumed here that the interfacial layer 11 mentioned above is a film of aluminum oxide ($Al_2O_3$).

Additional components not shown are explained below. There is a first interlayer insulating film of transparent material which covers the silicon oxide film 105 on which are formed the interfacial layer 11 and the negative charge accumulation layer 13. It is coated with a light-shielding film having an opening coinciding with the light receiving region of the buried diode D. The light-shielding film is coated with a second interlayer insulating film, on which are optionally formed an antireflection film, color filer layer, and condenser lens.

As mentioned above, the solid-state imaging device 1 is constructed such that the semiconductor substrate 101 has the diode D (as a sensor) formed thereon which is composed of the P-well diffusion layer 102 and the N-type diffusion layer 103 arranged on top of the layer and the top of them is coated with the negative charge accumulation layer 13 with the interfacial layer 11 interposed between them which contains a second metallic substance having higher electronegativity. This structure gives rise to dipoles p in the interfacial layer 11 such that the side adjacent to the negative charge accumulation layer 13 is positive and the side adjacent to the semiconductor substrate 101 (or the N-type diffusion layer 103 of the diode D) is negative. The dipoles p produce the negative bias effect in the negative charge accumulation layer, which effectively attracts positive charges to the surface of the semiconductor substrate 101. The attracted charges form the hole accumulation layer to compensate the interface state.

The forgoing structure obviates the necessity of providing the surface of the semiconductor substrate 101 (or the surface of the N-type diffusion layer 103 of the diode D) with the hole accumulation layer (or an impurity diffusion layer) that needs high-temperature heat treatment; however, it forms the HAD structure which has a hole accumulation layer arising from effective attraction of positive charges, thereby preventing the occurrence of dark current.

Consequently, the solid-state imaging device 1 has the N-type diffusion layer 103, which functions as the charge accumulation part of the diode D, formed at a shallow position on the surface of the semiconductor substrate 101. This structure permits efficient transfer of charges to the floating diffusion 9, which is connected to the diode D through the transfer gate 5.

As compared with the related-art structure in which the negative charge accumulation layer 13 alone is formed on the silicon oxide film 105 without the interfacial layer 11 interposed between them, the structure according to the embodiment in which there exists the interfacial layer 11 that causes dipoles to occur produces more efficiently the negative bias effect in the negative charge accumulation layer on account of the dipoles p. This permits positive charges to be attracted more easily to the surface layer of the semiconductor substrate 101. The result is that the negative charge accumulation layer 13, which is hard to process owing to the above-mentioned first metallic substance contained therein, can be made thinner. Incidentally, the interfacial layer 11 that causes dipoles p to occur will function satisfactorily if it is as thick as several atoms. Therefore, the total thickness of the interfacial layer 11 and the negative charge accumulation layer 13 could be smaller than the thickness of the negative charge accumulation layer 13 which is formed alone without the interfacial layer 11.

The reason why the negative bias effect in the negative charge accumulation layer is improved by dipole formation may be explained after the following model. One way of controlling the threshold voltage of the metal gate with the gate insulating film of high-dielectric film is to coat the high-dielectric film of hafnium compound (such as HfSiON) with a capping film of rare earth element and subsequently perform heat treatment to diffuse the rare earth element. The thus modified gate changes in effective work function (as reported in H. C. Wen et al., 2007 VLSI symp. p. 160; P, Sivasubramani et al., 2007 VLSI symp. P. 68). In other words, diffusion of rare earth atoms through the HfSiON film into the lower interfacial layer of silicon oxide film forms dipoles from oxygen atoms and rare earth atoms, which causes the gate to change in effective work function. It is presumed that the same phenomenon as in the forgoing model occurs in the structure according to the embodiment and this leads to the improved negative bias effect in the negative charge accumulation layer due to dipole formation.

<Method for Production of Solid-state Imaging Device>

Figure 3A:
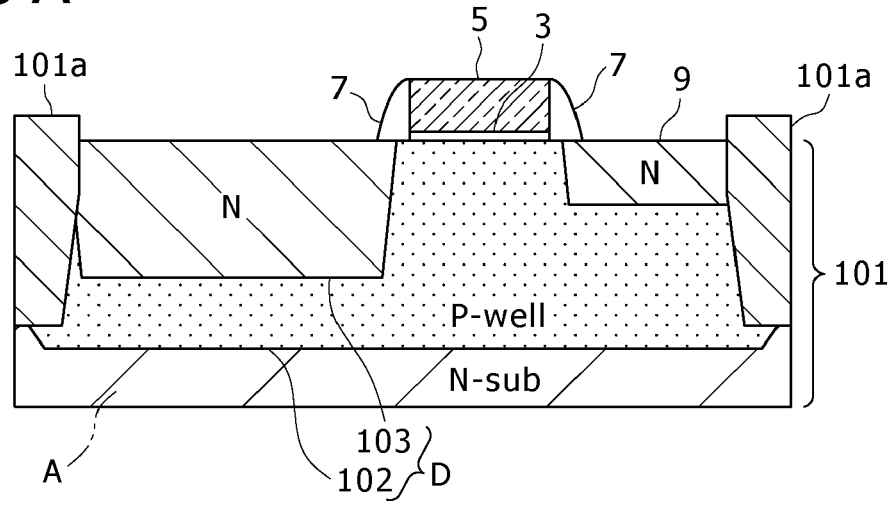
FIGS. 3A to 3C are diagrams showing the process of producing the solid-state imaging device according to the embodiment of the present invention.
Figure 3B:
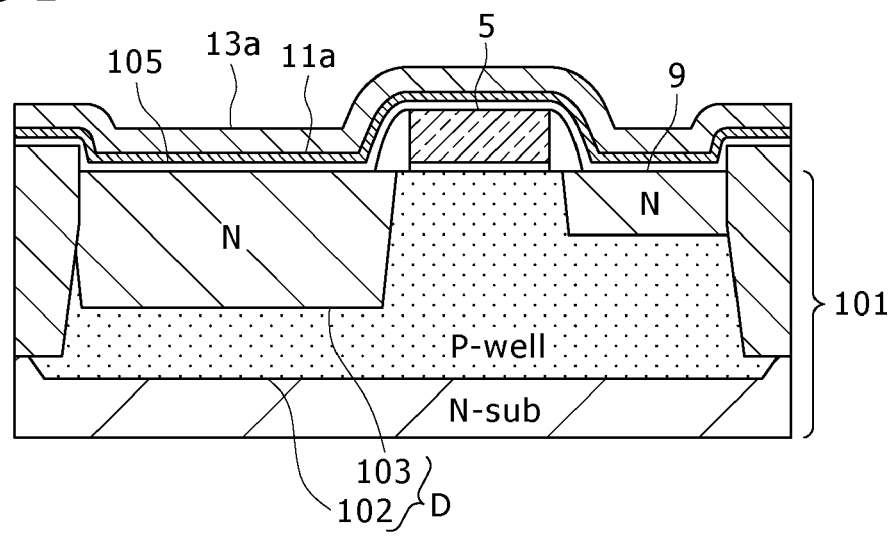
Figure 3C:
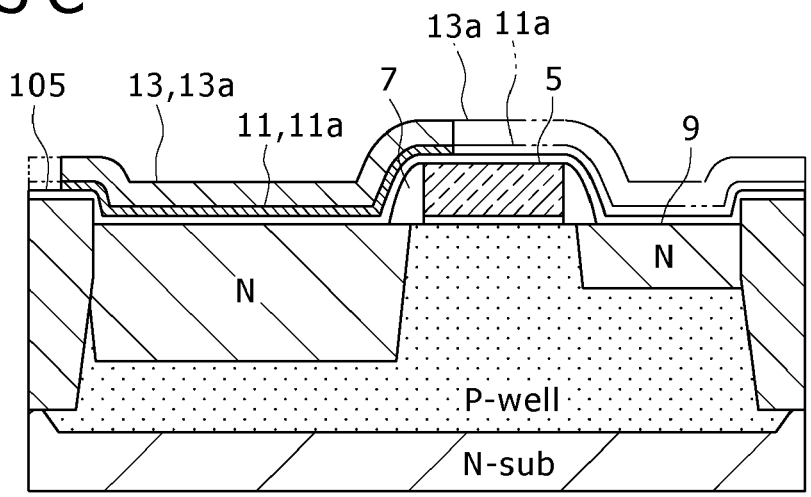

The solid-state imaging device shown in FIG. 1 is produced by the process shown in FIGS. 3A to 3C.

The process starts with forming the trench isolation 101a in the surface of the semiconductor substrate 101 of N-type single crystal silicon, so as to separate individual pixel regions, as shown in FIG. 3A. The next step is to perform ion implantation and heat treatment on the surface of the semiconductor substrate 101 so as to form the P-well diffusion layer 102 in each pixel region.

The next step is to form (by patterning) the transfer gate 5, with the gate insulating film 3 placed thereunder, in such a way that it traverses each pixel region (P-well diffusion layer 102) on the semiconductor substrate 101. This step also forms the reset gate and the amplifier gate which are not shown. This step also forms a diffusion layer (such as extension region) which is optional. The gate electrode has its lateral sides covered with the insulating side walls 7.

Ion implantation and ensuing heat treatment are performed on the surface of that side of the P-well diffusion layer 102 which is separated by the transfer gate 5. In this way there is formed the diode D, which is composed of the P-well diffusion layer 102 and the N-type diffusion layer 103, on the surface of the semiconductor substrate 101.

Ion implantation and ensuing heat treatment are also performed on the surface of the other side of the P-well diffusion layer 102 which is separated by the transfer gate 5, so as to form the floating diffusion 9 of N-type diffusion layer.

The next step shown in FIG. 3B is to form the silicon oxide film 105 (1 to 10 nm thick) that covers the transfer gate 5, diode D, and floating diffusion 9 which have been formed on the semiconductor substrate 101. This step may be accomplished by any of thermal oxidation, chemical oxidation with a chemical solution, thermal CVD, and plasma CVD.

The silicon oxide film 105 is coated with the film 11a of aluminum oxide (to become the interfacial layer later), which is 0.1 to 2 nm thick or equivalent to a thickness of several atoms. This step may be accomplished by any of physical vapor deposition (PVD), metal-organic chemical vapor deposition (MOCVD), and atomic layer deposition (ALD).

The film 11a is coated with the film 13a of hafnium oxide (to become the negative charge accumulation layer later), which is about 1 to 10 nm thick. This step may be accomplished by any of PVD, MOCVD, and ALD.

The next step shown in FIG. 3C is to perform pattern etching on the films 13a and 11a in such a way that they remain in the light-receiving region of the diode D. Thus there are formed the interfacial layer 11 and the negative charge accumulation layer 13. This step may be accomplished by lithographically forming a resist pattern on the film 13a and then etching the film 13a and the film 11a sequentially through the resist pattern.

On the interfacial layer 11 and the negative charge accumulation layer 13 are formed additional components in the usual way according to need.

The process mentioned above yields the solid-state imaging device which has been explained above with reference to FIG. 1. It does not need forming the hole injection layer, which is a diffusion layer that needs high-temperature heat treatment, after it has formed the diode D (which is composed of the P-well diffusion layer 102 and the N-type diffusion layer 103) and the floating diffusion 9 (which is an N-type diffusion layer). Therefore, it yields the solid-state imaging device of HAD structure which has the hole accumulation layer to attract positive charges by utilizing the negative bias effect in the negative charge accumulation layer 13 mentioned above.

The solid-state imaging device produced as mentioned above has the interfacial layer 11 which enhances the negative bias effect due to the negative charge accumulation layer 13 and hence is superior to the related-art one, which has the negative charge accumulation layer 13 alone on the silicon oxide film 105, in that the negative charge accumulation layer 13, which is hard to form, can be made thinner. The interfacial layer 11 to generate dipoles p will function satisfactorily so long as it has a thickness of several atoms. Therefore, the total thickness of the interfacial layer 11 and the negative charge accumulation layer 13 in the foregoing structure can be thinner than the thickness of the negative charge accumulation layer 13 alone without the interfacial layer 11 in the related-art structure. This leads to the advantage that pattern etching on the film 13a (to become the negative charge accumulation layer later) and the film 11a (to become the interfacial layer later) can be accomplished easily without adverse effect on the silicon oxide film 105 thereunder even at the stepped part.

The foregoing manufacturing process is assumed to be applied to the solid-state imaging device with CMOS sensors. However, it can also be applied to solid-state imaging devices with sensors of any other kinds, particularly, diode type sensors. An example of such solid-state imaging devices is a CCD sensor provided with the diode D (as the light receiving sensor) as shown in FIG. 1. It is composed of the semiconductor substrate, the diode D, the channel region (which is an impurity diffusion layer), and the transfer region, which are sequentially arranged in the order mentioned. It has the read-out gate (which also functions as the first transfer electrode) in such a way as to cover the channel region and the transfer region. It also has the second transfer electrode on the transfer region, with the edge of the former overlapping the read-out gate. The solid-state imaging device of this structure also produces the same effect as that according to the foregoing embodiment, if the diode D has the silicon oxide film, interfacial layer, and negative charge accumulation layer sequentially formed thereon. The result is an increase in the amount of charges to be read into the transfer region through the channel region.

It should be understood by those skilled in the art that various modifications, combinations, sub-combinations and alternations may occur depending on design requirements and other factors insofar as they are within the scope of the appended claims or the equivalent thereof.

What is claimed is:

1. A solid-state imaging device comprising:
   a semiconductor substrate;
   a sensor with an impurity diffusion layer formed on a surface layer of said semiconductor substrate;
   a negative charge accumulation layer formed on said sensor from an insulating material containing a first metallic substance; and
   an interfacial layer formed between said sensor and said negative charge accumulation layer from an insulating material containing a second metallic substance having greater electronegativity than said first metallic substance.

2. The solid-state imaging device of claim 1, further comprising a silicon oxide film which is formed between said interfacial layer and said sensor.

3. The solid-state imaging device of claim 1, wherein said sensor is a diode which has an N-type diffusion layer formed on a P-type diffusion layer.

4. The solid-state imaging device of claim 3, wherein said diode is flanked with an N-type diffusion layer through a gate electrode formed on said semiconductor substrate.

5. The solid-state imaging device of claim 1, wherein said negative charge accumulation layer is formed from hafnium oxide.

6. The solid-state imaging device of claim 5, wherein said second metallic substance is any one of aluminum (Al), titanium (Ti), tantalum (Ta), vanadium (V), niobium (Nb), protactinium (Pa), chromium (Cr), molybdenum (Mo), tungsten (W), manganese (Mn), technetium (Tc), rhenium (Re), ruthenium (Ru), cobalt (Co), and nickel (Ni).

7. The solid-state imaging device of claim 6, wherein said interfacial layer is formed from an oxide of said second metallic substance.

* * * * *